United States Patent
Liu et al.

(10) Patent No.: US 7,564,687 B2
(45) Date of Patent: Jul. 21, 2009

(54) HEAT DISSIPATION DEVICE HAVING A FIXING BASE

(75) Inventors: Jie Liu, Shenzhen (CN); Chun-Jiang Shuai, Shenzhen (CN); Jin-Song Feng, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 11 days.

(21) Appl. No.: 11/690,046

(22) Filed: Mar. 22, 2007

(65) Prior Publication Data

US 2008/0232068 A1 Sep. 25, 2008

(51) Int. Cl.
*H05K 7/20* (2006.01)

(52) U.S. Cl. .................. 361/704; 361/719; 257/718; 257/719; 257/727; 165/80.3; 165/185

(58) Field of Classification Search .................. None
See application file for complete search history.

(56) References Cited

U.S. PATENT DOCUMENTS

| | | | | |
|---|---|---|---|---|
| 5,276,585 A * | 1/1994 | Smithers | ...................... | 361/704 |
| 5,594,624 A * | 1/1997 | Clemens et al. | ............. | 361/704 |
| 5,602,719 A * | 2/1997 | Kinion | ....................... | 361/704 |
| 5,953,212 A * | 9/1999 | Lee | .............................. | 361/709 |
| 6,093,961 A * | 7/2000 | McCullough | ................ | 257/718 |
| 6,153,932 A * | 11/2000 | Liang | .......................... | 257/712 |
| 6,229,705 B1 * | 5/2001 | Lee | .............................. | 361/704 |
| 6,310,774 B1 * | 10/2001 | Lee | .............................. | 361/704 |
| 6,456,493 B1 * | 9/2002 | Lee | .............................. | 361/704 |
| 6,476,484 B1 * | 11/2002 | Liang | .......................... | 257/718 |
| 6,556,443 B1 * | 4/2003 | Wei | .............................. | 361/704 |
| 6,644,396 B2 * | 11/2003 | Liang | .......................... | 165/185 |
| 6,728,103 B1 * | 4/2004 | Smedberg | ................... | 361/703 |
| 7,277,288 B2 * | 10/2007 | Lee et al. | .................... | 361/704 |
| 7,307,842 B1 * | 12/2007 | Liang | ......................... | 361/710 |
| 2006/0198107 A1 * | 9/2006 | Azar et al. | .................. | 361/704 |
| 2008/0000618 A1 * | 1/2008 | Liang | ........................ | 165/80.3 |

* cited by examiner

*Primary Examiner*—Boris Chervinsky
(74) *Attorney, Agent, or Firm*—Frank R. Niranjan

(57) ABSTRACT

A heat dissipation device includes a heat sink and a fixing base for securing the heat sink to a heat-generating device. The heat sink includes a base and a pair of flanges formed on two opposite sides of the base. The fixing base includes a pair of side plates formed on a first set of two opposite sides thereof. A pair of resilient barbs extends inwards from an end portion of each side plate. The fixing base is placed on the heat sink and the resilient barbs tightly clasp first two opposite sides of the heat-generating device to press the base of the heat sink towards the heat-generating device. The flanges of the base of the heat sink abut second two opposite sides of the heat-generating device to avoid movement of the heat sink along a direction perpendicular to the flanges.

11 Claims, 5 Drawing Sheets

HEAT DISSIPATION DEVICE HAVING A FIXING BASE

BACKGROUND OF THE INVENTION

1. Field of the Invention

The present invention relates to heat dissipation devices, and particularly to a heat dissipation device having a fixing base for securing a heat sink to a heat-generating device, such as a chipset mounted on a printed circuit board.

2. Description of Related Art

It is widely acknowledged that a heat-generating device such as a chipset in a PC may generate much heat when operating and it is necessary to dissipate the heat to avoid the degradation of performance and the eventual burn-out of the chipset. Hence, a heat sink attached on the chipset to dissipate all the heat generated by the chipset is needed.

A heat sink device is commonly used for high speed chipsets. An example of a heat sink device is shown in U.S. Pat. No. 6,153,932. The heat sink device includes a heat sink attached to the chipset and a fixing base for securing the heat sink to the chipset. The heat sink defines two insertion holes in opposite sides thereof. The fixing base includes a rectangular frame and two side plates extending downwards from a first set of two opposite sides of the frame. Each side plate has a fastening hook extending inwards from a distal end thereof, for clipping on the chipset. A pair of protruding rods extends downwards from a second set of two opposite sides of the frame of the fixing base corresponding to the insertion holes in the heat sink. Four resilient bars are formed on inner walls of the second set of two opposite sides of the frame of the fixing base. Each resilient bar includes a protruding part at an end thereof, for pressing on a top surface of the heat sink. In assembly, the fixing base is placed on the heat sink and the fastening hooks clamp at edges of the two opposite sides of the chipset. The protruding rods are inserted into the insertion holes so that the protruding parts tightly press the heat sink towards the chipset. Therefore, the fixing base, the base and the chipset are tightly, closely fixed together.

However, the above structure using the protruding rods inserting in the heat sink and the chipset to lock and fix the heat sink to the chipset is complicated and inconvenient for assembly of the heat sink device. Furthermore, the heat sink device may destroy the chipset when the protruding rods of the heat sink extend into the chipset. Finally, to form the insertion holes in the heat sink needs additional machining, which means additional cost.

Thus, an improved heat dissipation device which overcomes above-mentioned problems is required.

SUMMARY OF THE INVENTION

A heat dissipation device in accordance with a preferred embodiment of the present invention includes a heat sink and a fixing base for securing the heat sink to a heat-generating device. The heat sink includes a base and a pair of flanges formed on two opposite sides of the base. The fixing base includes a pair of side plates formed on a first set of two opposite sides thereof. A pair of resilient barbs extends inwards from an end portion of each side plate. The fixing base has a plurality of pressing beams each being integral with two opposite sides of the fixing base and extending all across an opening of the fixing base. The pressing beams are located between fins of the heat sink and press a base of the heat sink toward the heat-generating device. The flanges of the base of the heat sink abut a first set of two opposite sides of the heat-generating device to avoid movement of the heat sink along a direction perpendicular to the flanges. The fixing base is placed on the heat sink and the resilient barbs tightly clasp a second set of two opposite sides of the heat-generating device to press the base of the heat sink towards the heat-generating device. Thus, the fixing base firmly secures the heat sink to the chipset.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
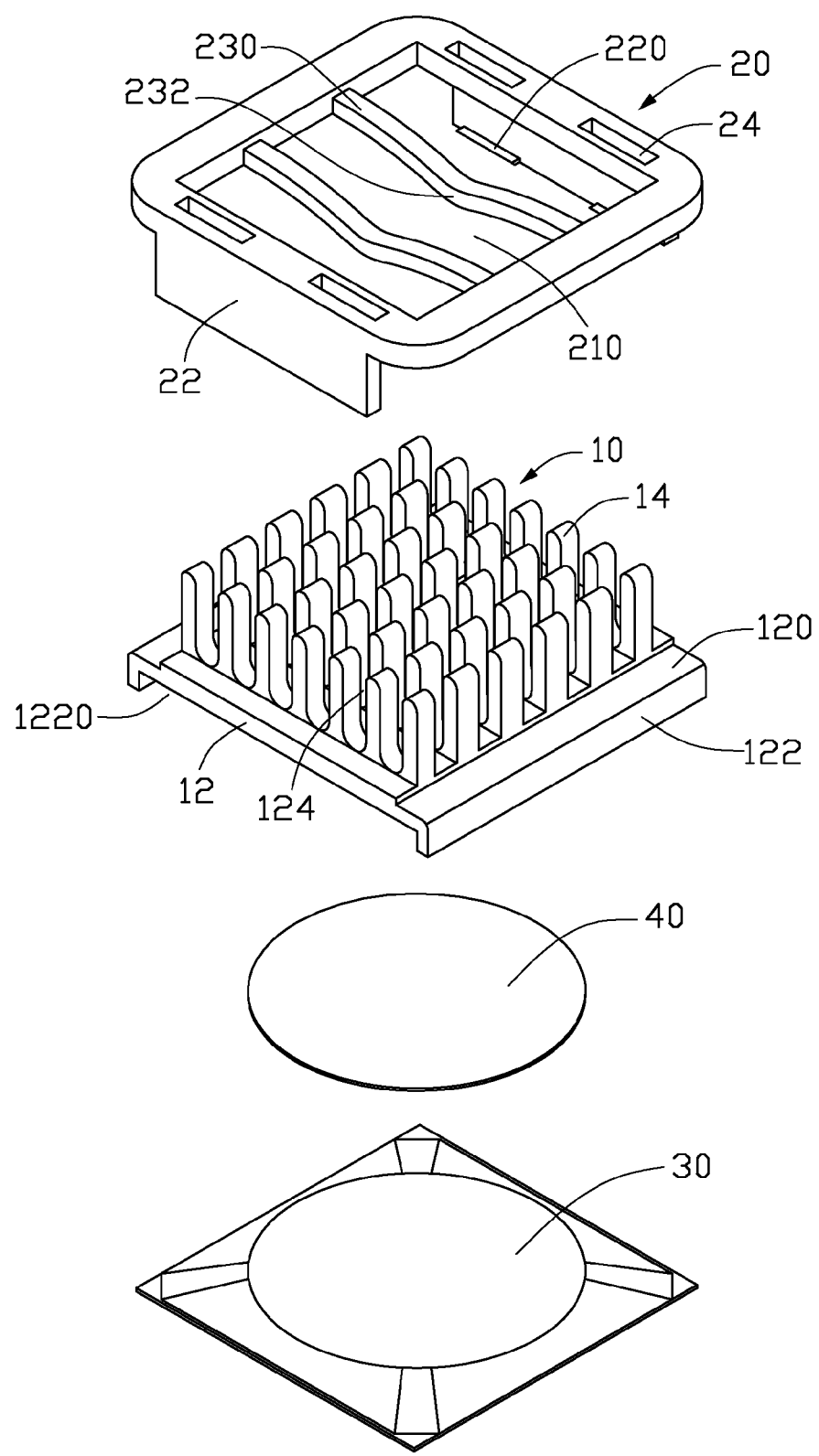
FIG. 1 is an exploded, isometric view of a heat dissipation device according to a preferred embodiment of the present invention, and a chipset having a heat-conducting piece.

FIG. 1 illustrates a heat dissipation device in accordance with a preferred embodiment of the present invention, which comprises a heat sink 10 and a fixing base 20 for securing the heat sink 10 to a heat-generating device, such as a chipset 30 having a heat-conducting piece 40 attached thereon.

The heat sink 10 is integrally extruded from a heat conductive material, such as aluminum, and comprises a base 12 and a plurality of heat-dissipating fins 14 extending vertically and upwardly from a top surface of the base 12. A plurality of channels 124 is crossed by a number of transverse channels (not labeled) and a number of longitudinal channels (not labeled). Two opposite bulges 120 extend horizontally and outwardly from two opposite sides of the base 12. Two opposite flanges 122 extend vertically and downwardly from end portions of the bulges 120. There is no fin on the bulges 120 and flanges 122. The flanges 122 define a receiving space 1220 for receiving the chipset 30 between the flanges 122. The heat-dissipating fins 14 may be in any configuration known in the art, providing that they can effectively dissipate the heat produced by the chipset 30.

Figure 2:
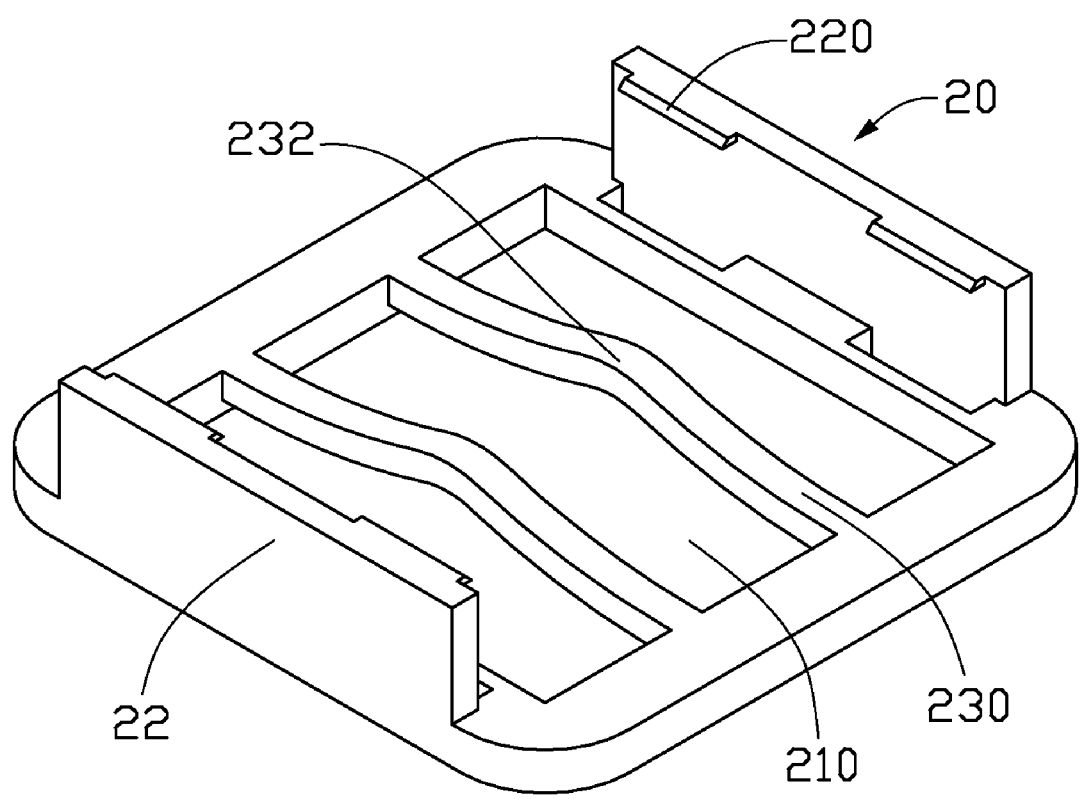
FIG. 2 is a bottom view of a fixing base of FIG. 1.

Also referring to FIG. 2, the fixing base 20 is made of resilient plastic, and is a substantially rectangular frame. The fixing base 20 defines an opening 210 in a center thereof for the heat-dissipating fins 14 extending through. Two opposite side plates 22 extend downwards from first two opposite short side edges of the fixing base 20. Each side plate 22 forms two opposite inner barbs 220 extending horizontally from a distal end thereof. Two pressing beams 230 are disposed across two opposite long sides of the fixing base 20 and received in corresponding channels 124 of the heat sink 10. Each pressing beam 230 has two ends integral with the two opposite long sides of the fixing base 20. The pressing beams 230 are parallel to each other and each has an arched-shaped configuration so that each pressing beam 230 has a lower portion 232 for pressing the base 12 of the heat sink 10 towards the chipset 30. A pair of holes 24 are defined in top of the fixing base 20 and close to each short side edge for facilitating operation of the fixing base 20.

Figure 3:
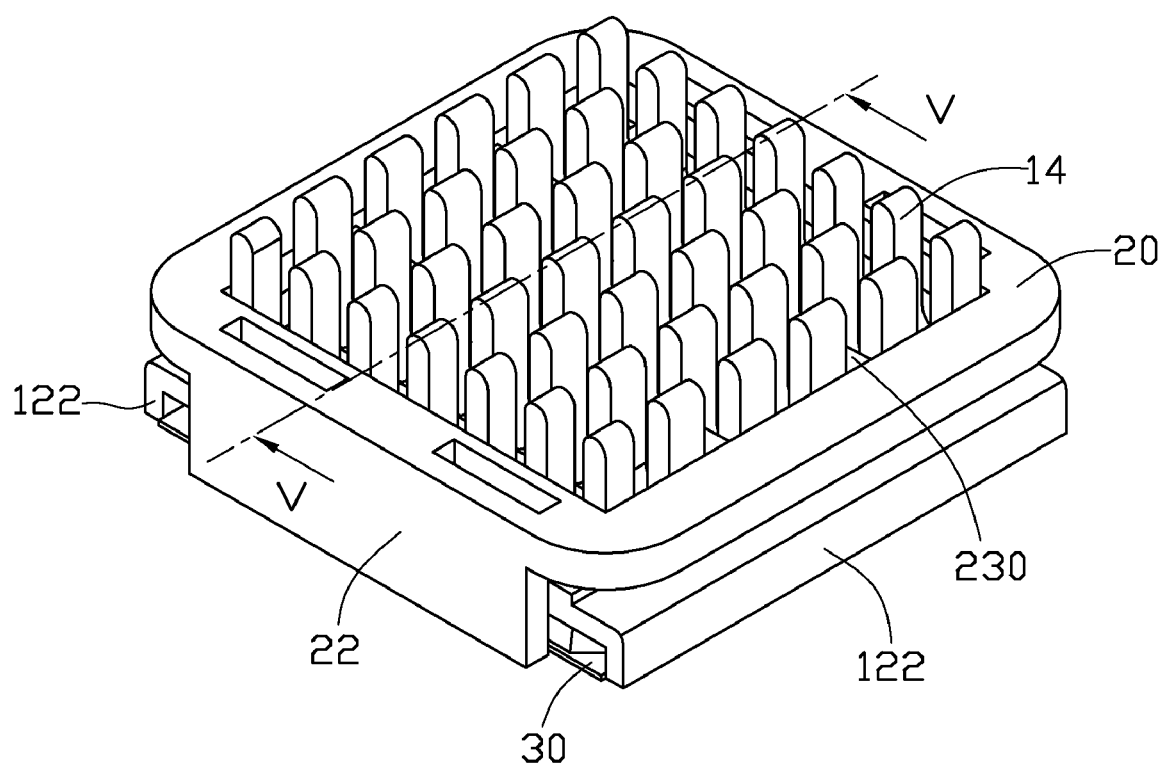
FIG. 3 is an assembled view of FIG. 1.
Figure 4:
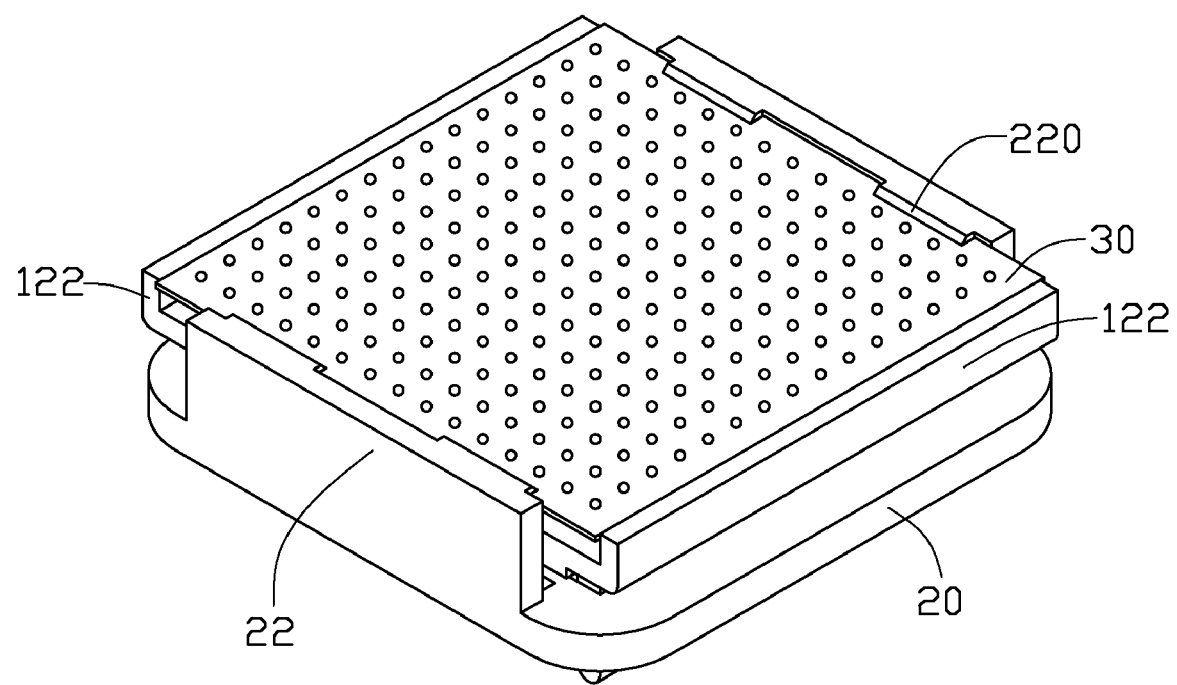
FIG. 4 is a bottom view of FIG. 3.
Figure 5:
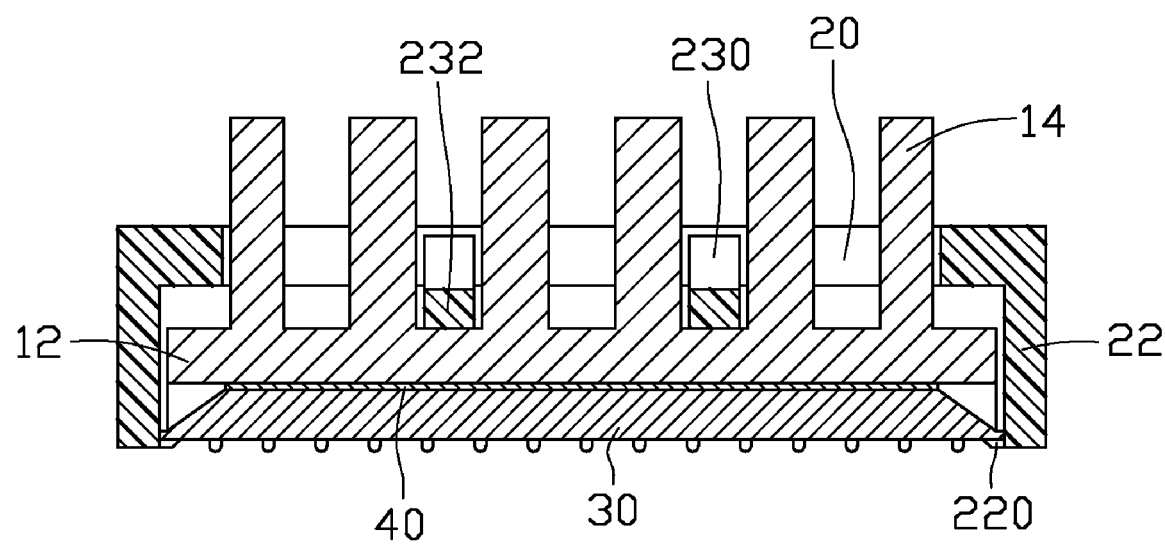
FIG. 5 is a cross-sectional view of the heat dissipation device taken along line V-V in FIG. 3.

Referring to FIGS. 3-5, in assembly, the heat sink 10 rests on the chipset 30, with a bottom surface of the base 12 of the heat sink 10 contacting with the heat-conducting piece 40. The heat-conducting piece 40 according to the preferred embodiment is a thermal tape or thermal grease, which can obviate air gaps between the base 12 of the heat sink 10 and the chipset 30. The flanges 122 of the base 12 abut on a first set of two opposite sides of the chipset 30, for avoiding the movement of the heat sink 10 along a first direction perpendicular to the flanges 122. The chipset 30 has an array of solder balls (not shown) on a bottom surface thereof. The solder balls are soldered to a printed circuit board (not shown) whereby the chip set 30 is secured on the printed circuit board. The fixing base 20 is placed on the heat sink 10 with the heat-dissipating fins 14 extending through the opening 210 and the pressing beams 230 are received in the channels 124 defined by the heat-dissipating fins 14. The inner barbs 220 tightly clasp a second set of two opposite sides of the chipset 30 so that the lower portions 232 of the pressing beams 230 tightly press the base 12 of the heat sink 10 towards the heat-conducting piece 40 and the chipset 30. Thus, the heat sink 10 is sandwiched between the fixing base 20 and the chipset 30 by the inner barbs 220 grasping the chipset 30 and the pressing beams 230 of the fixing base 20 pressing the heat sink 10 towards the chipset 30. The fixing base 20, the heat sink 10 and the chipset 30 can closely install together. The four sides of the chipset 30 are enclosed via the flanges 122 of the heat sink 10 and the side plates 22 of the fixing base 20, so stability of the chipset 30 is improved. Furthermore, the side plates 22 of the fixing base 20 also abut against opposite sides of the base 12 of the heat sink 10 other than those on which the bulges 120 are formed. Thus, the heat sink 10 is prevented from moving along a second direction parallel to the flanges 122. Accordingly, the heat sink 10 is firmly placed in position even when the heat sink 10 is subjected to vibration. In disassembly, the side plates 22 of the fixing base 20 are forced to open outwardly so that the barbs 22 disconnect with the second set of two opposite side of the chipset 30, whereby the heat sink 10 can be freed from the chipset 30.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device adapted for dissipating heat generated by a chipset mounted on a printed circuit board, comprising:

a fixing base having a pair of side plates formed on a first set of two opposite sides thereof and at least a pressing beam formed across a second set of two opposite sides thereof, each side plate comprising at least a resilient barb extending inwards from an end portion thereof; and a heat sink attached with the chipset, being positioned between the fixing base and the chipset, the heat sink comprising a base having two opposite sides abutting a first set of two opposite sides of the chipset to avoid movement of the heat sink along a direction perpendicular to the two opposite sides of the base;

wherein the resilient barbs of the fixing base tightly clasp a second set of two opposite sides of the chipset and the at least a pressing beam presses the heat sink toward the chipset;

wherein the heat sink comprises two opposite flanges formed on the two opposite sides of the base of the heat sink; and wherein the two opposite flanges of the heat sink abut the first set of two opposite sides of the chipset, and the resilient barbs of the fixing base abut the second set of two opposite sides of the chipset.

2. The heat dissipation device as claim 1, wherein the fixing base is made of resilient plastic and is a substantially rectangular frame.

3. The heat dissipation device as claim 2, wherein the at least a pressing beam has an arched-shaped configuration and comprises a lower portion pressing towards the heat sink.

4. The heat dissipation device as claim 1, wherein the at least a pressing beam has two ends integral with the second set of two opposite sides of the fixing base.

5. The heat dissipation device as claim 1, wherein the chipset is received between the two flanges of the base of the heat sink.

6. The heat dissipation device as claim 5, wherein the heat sink is blocked by the chipset abutting against the flanges in a direction perpendicular to the flanges.

7. A heat dissipation device comprising:

a heat-generating device;

a heat sink having two flanges formed on first two opposite sides thereof, the flanges abutting first two opposite sides of the heat-generating device;

a fixing base having two side plates formed at two opposite sides thereof, the side plates clasping second two opposite sides of the heat-generating device and abutting second two opposite sides of the heat sink, the fixing base further comprising at least a pressing beam having two ends integral with the fixing base, the at least a pressing beam pressing the heat sink toward the heat-generating device.

8. The heat dissipation device as claim 7, wherein the heat sink has a plurality of fins and the at least a pressing beam is located between the fins.

9. The heat dissipation device as claim 7, wherein the two ends of the at least a pressing beam are integral with the fixing base at two opposite sides thereof which are other than the opposite sides at which the side plates are formed.

10. The heat dissipation device as claim 7, wherein the two flanges of the heat sink define a receiving space receiving the heat-generating device between the two flanges.

11. The heat dissipation device as claim 10, wherein the heat sink is blocked by the heat-generating device abutting against the flanges in a direction perpendicular to the flanges.

* * * * *